United States Patent
Dory et al.

(12) 
(10) Patent No.: US 6,614,122 B1
(45) Date of Patent: Sep. 2, 2003

(54) CONTROLLING UNDERFILL FLOW LOCATIONS ON HIGH DENSITY PACKAGES USING PHYSICAL TRENCHES AND DAMS

(75) Inventors: Thomas S. Dory, Gilbert, AZ (US); HengGee Lee, Chandler, AZ (US); David W. Young, Gilbert, AZ (US); Leigh E. Wojewoda, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,542

(22) Filed: Sep. 29, 2000

(51) Int. Cl.[7] ............................................... H01L 23/28
(52) U.S. Cl. ...................................... 257/787; 257/783
(58) Field of Search ................................ 257/730, 666, 257/676, 667, 787, 783, 698

(56) References Cited

U.S. PATENT DOCUMENTS

| | | | | |
|---|---|---|---|---|
| 4,857,989 A | * | 8/1989 | Mori et al. | |
| 4,926,240 A | * | 5/1990 | Regione | |
| 5,091,770 A | * | 2/1992 | Yamaguchi et al. | |

* cited by examiner

Primary Examiner—Sheila V. Clark
(74) Attorney, Agent, or Firm—Blakley, Sokoloff, Taylor & Zafman LLP

(57) ABSTRACT

An apparatus, comprising: a substrate having a surface; a die attached to the substrate surface; an underfill material positioned between the substrate surface and the die; and one or more barriers on the substrate surface adjoining the die, wherein the barriers controls flow of the underfill material.

21 Claims, 7 Drawing Sheets

VIEW A-A

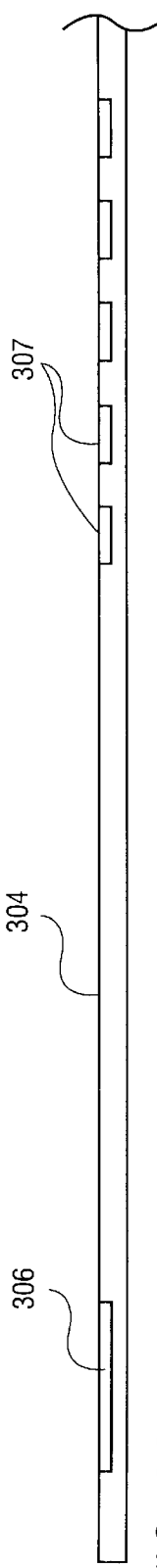
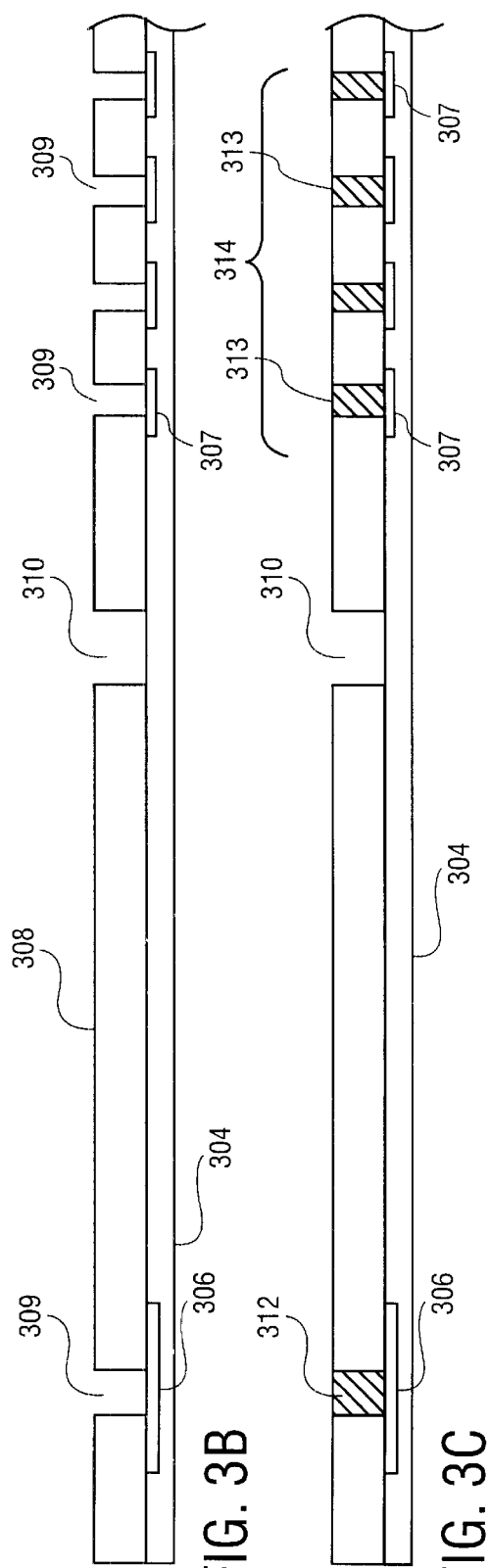
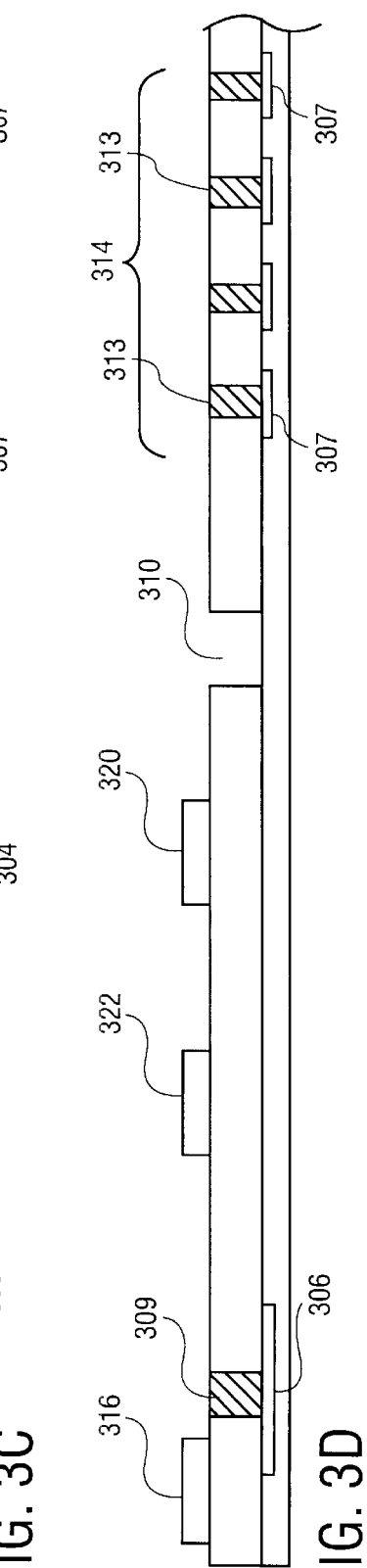
FIG. 3A  FIG. 3B  FIG. 3C  FIG. 3D

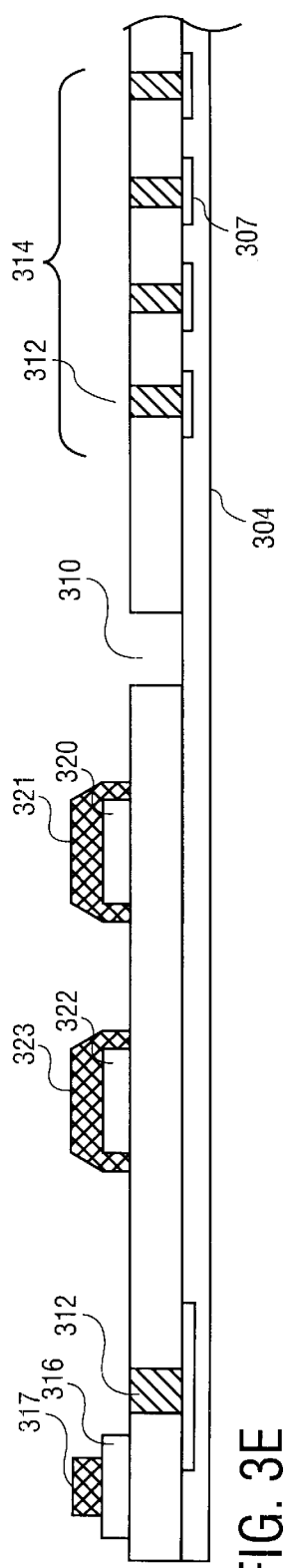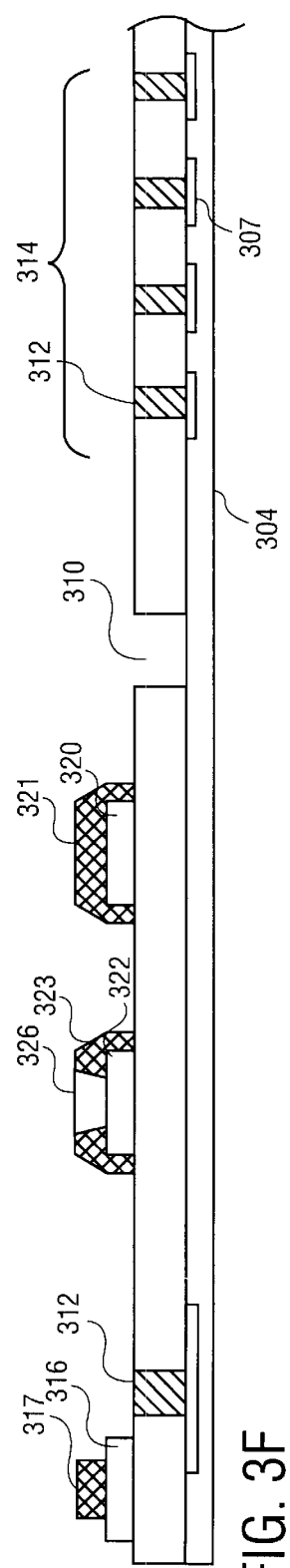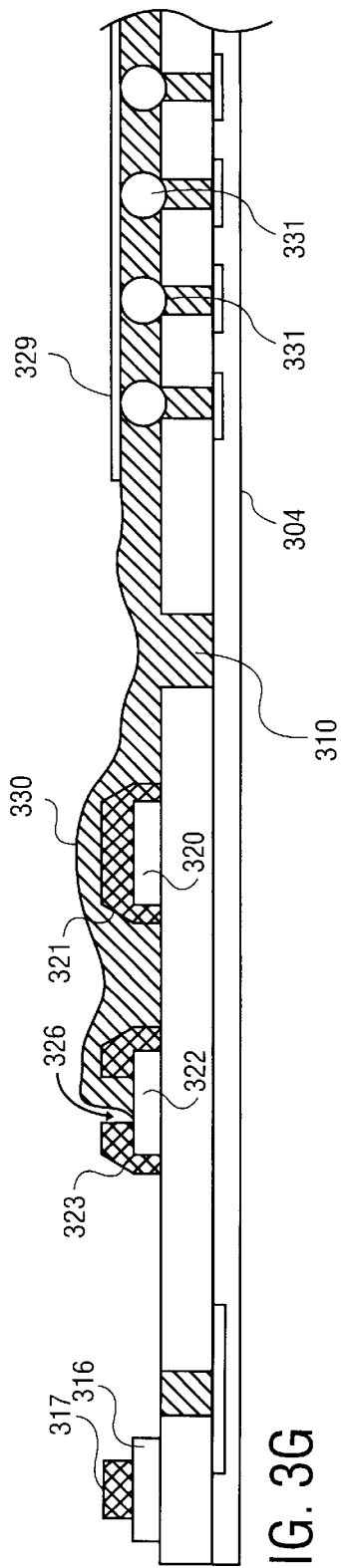

CONTROLLING UNDERFILL FLOW LOCATIONS ON HIGH DENSITY PACKAGES USING PHYSICAL TRENCHES AND DAMS

BACKGROUND OF THE INVENTION

1. Field of the Invention

This invention relates to the field of controlling flow of fluid materials and in particular to constructing barriers that restrict flow of an underfill material used to attach a silicon die to a substrate.

2. Discussion of Related Art

In the assembly of high density packaging, such as Organic Land Grid Array (OLGA) laminates that utilize Controlled Collapse Chip Connection (C4) flip-chip die technology, or the direct assembly of a surface mounted flip-chip die to a printed circuit board, an underfill material is typically required. The use of the underfill material, acting as an adhesive, prevents solder bumps on the silicon die from moving as a result of thermal cycling and electrically shorting during the life of the part. In addition, the underfill, acting as a thermal conductor, mediates the thermal missmatch between the silicon die and the organic polymer package (or printed circuit board). Further discussion will deal with C4 flip-chip dies (dies) attached to organic substrates but it is intended that the disclosure will apply to silicon flip-chip dies surface mounted to any number of other types of substrates such as printed circuit board substrates as well.

Referring to FIGS. 1a and 1b, the underfill material 102, a polymer, is applied in a liquid form to flow between the silicon die (die) C4 bumps 104 (shown dashed from opposite side in FIG. 1a) and a die attachment location (die perimeter) 106 on the substrate 108. The die 103 is assembled to the substrate surface 108 and the excess underfill material 102, typically an epoxy, may flow out from between the die 103 and substrate 108 surfaces. The underfill 102 may flow sufficiently to cover solder lands 110 on the substrate 108 die side that later will be connected to passive electrical components such as capacitors. To preclude the covering of these solder (covered) lands 110 requires the design of a "keep out" area or zone for die side passive electrical component placement (passive component). Even with the keep out area, if passive electrical components are installed, opens or shorts may be observed due to solder flowing away from the passive electrical components as a result of the underfill material coating the passive electrical components.

BRIEF DESCRIPTION OF THE DRAWINGS

FIG. 3a is an illustration of a cross-section substrate with circuit lands;

FIG. 3b is an illustration of openings in a solder mask for a trench and openings to the metal circuit lines;

FIG. 3c is an illustration of a substrate with solder lands in the solder mask;

FIG. 3d is an illustration of a first layer of ink;

FIG. 3e is an illustration of a second layer of ink;

FIG. 3f is an illustration of a trench etched in the ink;

FIG. 3g is an illustration of overflow of barrier elements by the underfill material.

DETAILED DESCRIPTION OF THE PRESENT INVENTION

A novel structure and method for providing a barrier to restrict flow at assembly of an underfill material dispensed between a microchip and a substrate is disclosed. The novel structure and method will place a barrier, in the form of barrier elements such as trenches and dams, in the path of an underfill material flowing from between the die and the substrate. The manufacture of the trench and dam barrier elements can be performed at the same time and with the same procedures used to create solder masking and silkscreened ink identification markings. In the following description numerous specific details are set forth such as specific materials, equipment, and processes in order to provide a thorough understanding of the present invention. In other instances, well known computer assembly techniques and machinery have not been set forth in detail in order to minimize obscuring the present invention.

The present invention is a novel structure and method for providing the barrier made up of one or more barrier elements to control flow at assembly of the underfill material applied between the microchip that is a flip-chip silicon die (die) and the substrate. This structure and method allows for a tighter placement of passive electrical components around the die perimeter that results from a reduced "keep out" area. The present invention will deposit onto a substrate, the one or more barrier elements in the form of trenches, dams, or dams having trenches within. The present invention will make use of the solder masking and/or the component identification and description silk-screen coatings to manufacture the barrier elements. The barrier is positioned between one or more outer edges forming a perimeter of the die and passive component solder lands. The assembly process may attach the die to packaging material, such as OLGA, or directly to a printed circuit board such as a surface mount.

Each barrier element may be a trench positioned in the solder masking or a dam constructed with the same silkscreen material used for component identification and board descriptions. The barrier may be constructed from one or more trenches, one or more dams, or a combination of trenches and dams. Finally, top surfaces of none, some, or all of the dams may be laser etched to provide a trench within the dam material. Each barrier element may be constructed from process methods that are presently being used for other operations. The fabrication of barrier elements may not add new assembly operations in as much as the barrier element fabrication can be included in the current assembly operations.

Figure 1A:
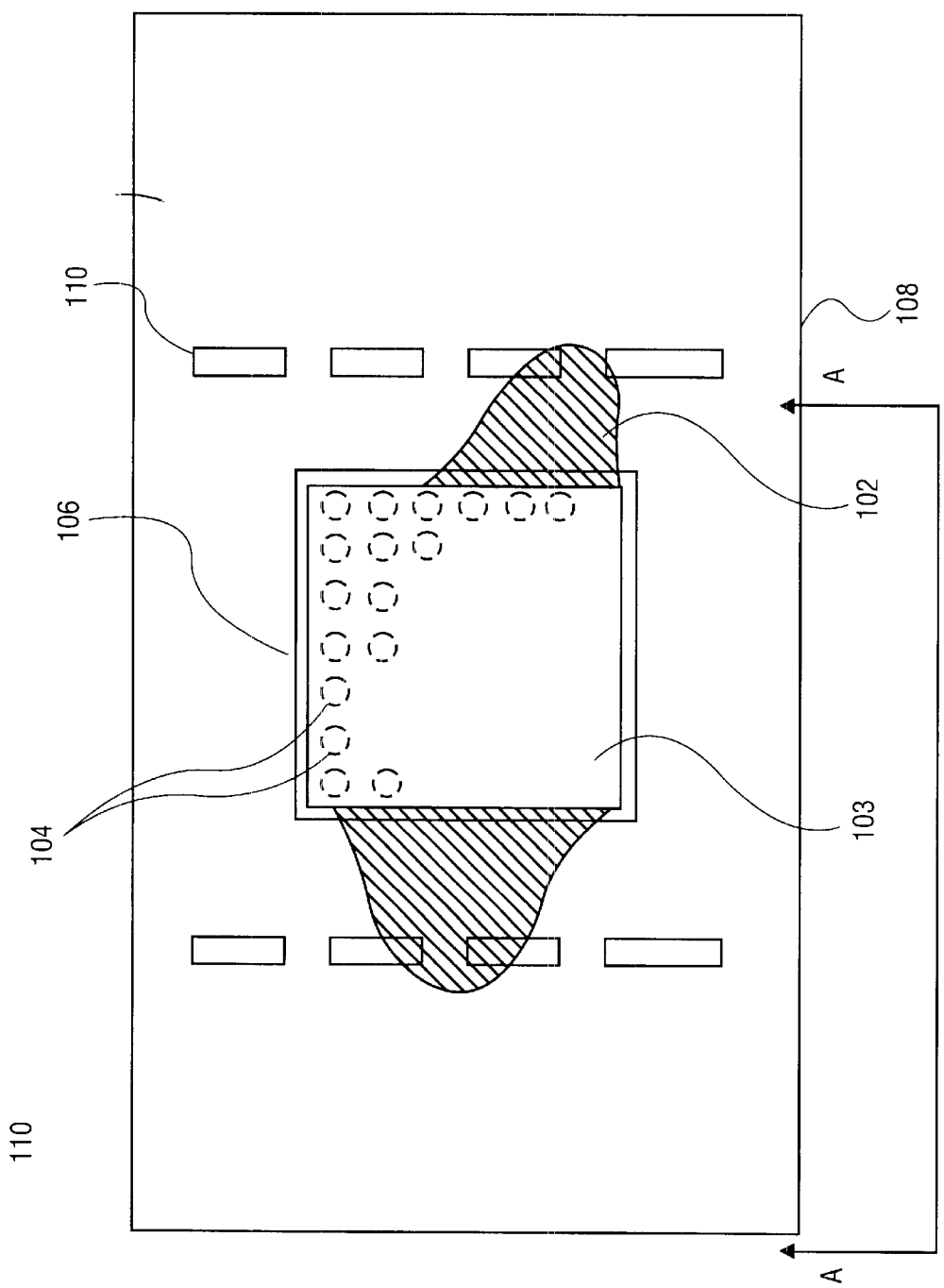
FIG. 1a is an illustration of top view of a die and a substrate with underfill material flowing out.
Figure 1B:
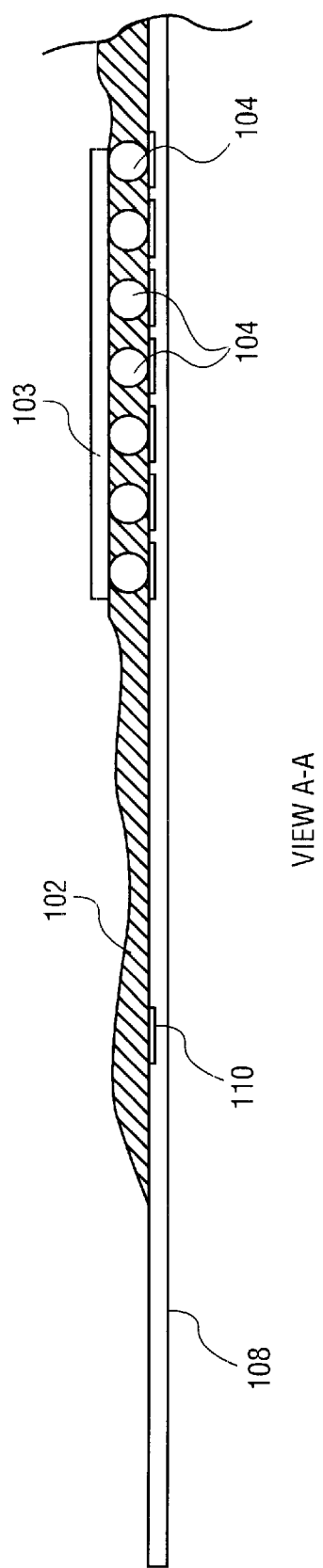
FIG. 1b is an illustration of a cross-section of the die and the substrate with underfill material flowing out.
Figure 2A:
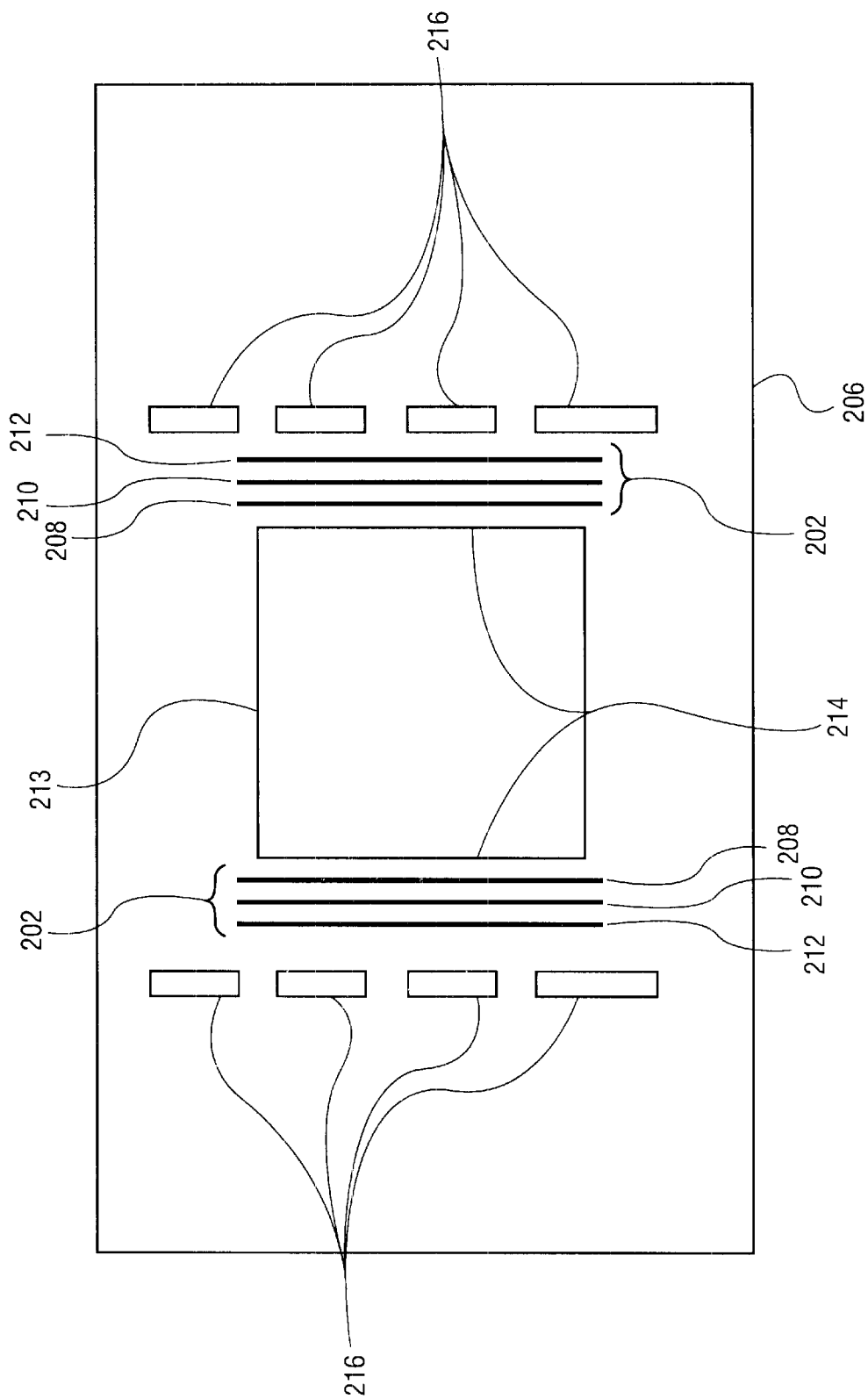
FIG. 2a is an illustration of the die and the substrate with barriers.
Figure 2B:
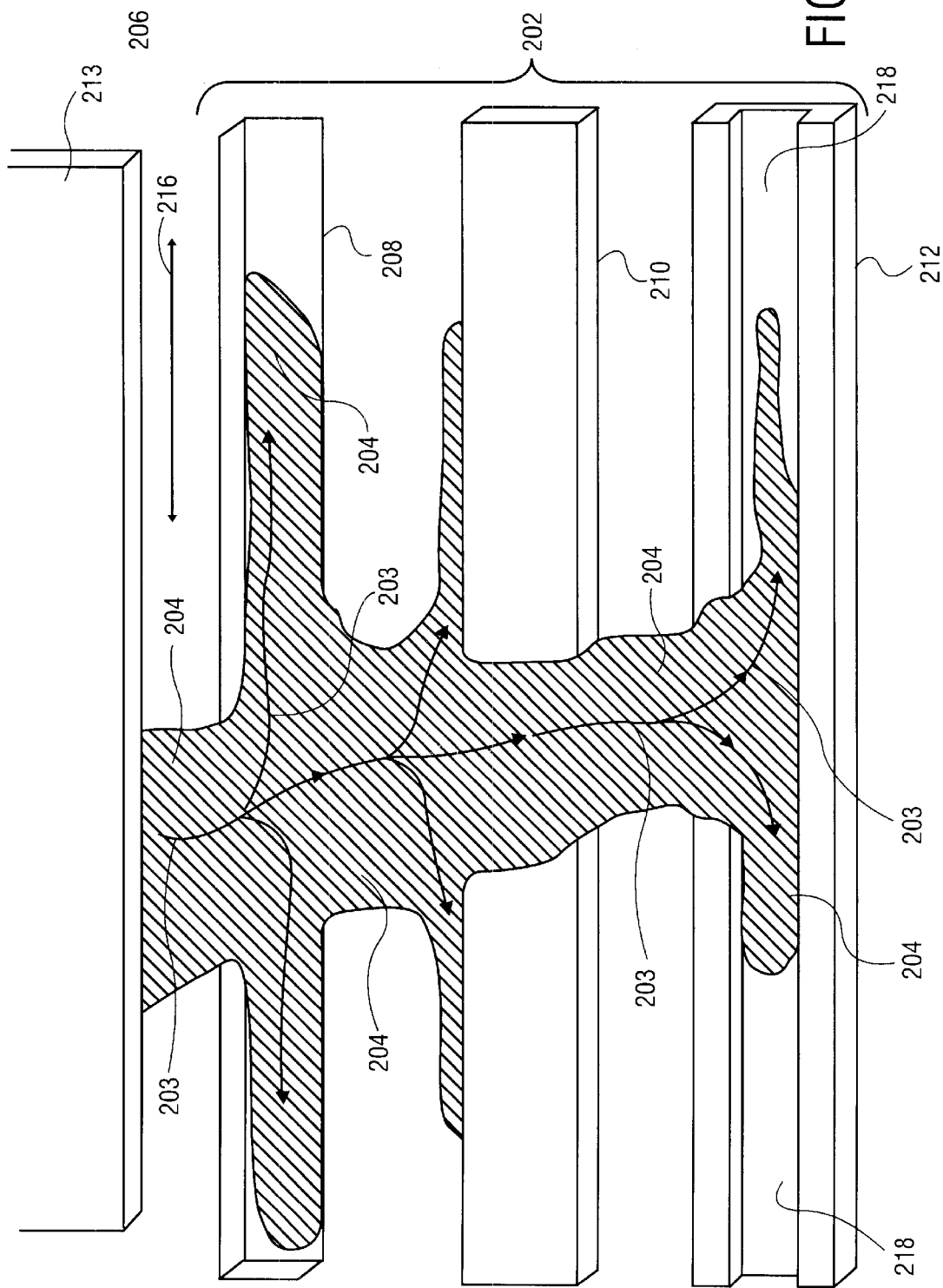
FIG. 2b is an illustration of the underfill material overflowing barrier elements.
Figure 2C:
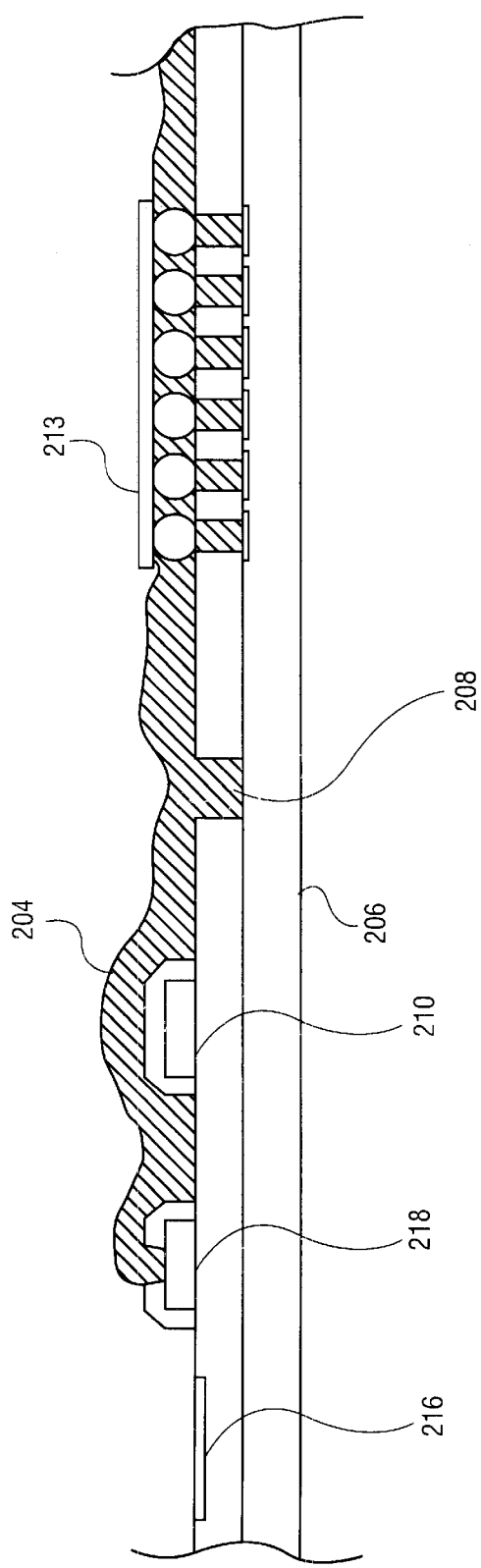
FIG. 2c is an illustration of a cross-section of the underfill material overflowing barrier elements.

Referring to FIGS. 2a, 2b, and 2c is shown an embodiment of the present invention has two barriers 202, each made with three barrier elements; a trench barrier element 208 (trench) constructed within solder masking (not shown), and two dams 210, 212 each constructed from silk-screen ink. Additionally, the second dam 210 has a trench 218 laser etched into a top surface of the dam 212. The barriers 202 restrict flow of underfill material 204 and as a result, allows for the placement of passive component lands 216 closer to the die 213. With the exception of the laser etch, the barrier elements 208, 210, 212 may be constructed using existing processing steps. Both solder mask trenches 208 and ink dams 210, 212 can be formed at the same time other features are formed. Ink dams 210, 212 are the same dimensions and type of ink used for standard ink markings and the solder masking trenches 208 follow standard design rules for depth and opening size.

Referring to FIGS. 2b and 2c, illustrates a barrier 202 to the flow (arrows) 203 of underfill material (cross-hatch) 204. The barrier 202 will allow passive components (such as capacitors) to be positioned in a portion of the area of a substrate 206 previously dedicated as a keep out zone. The barrier 202 may be made up from one or more barrier elements (elements) 208, 210, 212. Each barrier element 208, 210, 212 may be a trench 208; a dam 210; or a dam having a trench etched within 212. At assembly, excess underfill material 204 flows 203 out from between the die 213 and the substrate 206. The flow 203 of underfill material 204 may first contact a trench 208 and the underfill material 204 can spread out in a direction 216 of the length of the trench 208. Underfill material 204 that flows across (breaches) the trench 208 may contact a second barrier element, a dam 210 that will further direct flow 203 along the direction 216 of the length of the dam 210. Underfill material 204 that breaches the dam 210 may contact a third barrier element, a dam having a trench etched within 212. The third barrier element can further deflect flow 203 along the length of the dam 210 as well as along the length of the trench etched within the dam 214.

Referring to FIG. 3a, a substrate 304 contains a land 306 to be later coated with solder and finally connected to an electrical passive component (not shown. In addition, other lands 307 exist that will be later coated with solder and connect to the solder balls of a die (not shown). FIG. 3b illustrates the one or more coatings of the solder mask 308. The solder mask 308 provides openings (over the lands) 309 in the mask 308 to be later filled in with solder. At the same time, an opening 310 is provided in the solder mask 308 to act as a trench 310. The solder mask 308 is then cured with heat or a UV light.

Referring to FIG. 3c, a solder wave operation is performed that fills in with solder, the openings 312, 313 positioned over metal lands 306. The solder wave operation can be done with the substrate surface to be soldered positioned down so that gravity can assist in removing excess solder. Since solder does not adhere to a non-metallized printed circuit board surface, the trench 310, positioned over the substrate material 304 may not retain solder. The trench 310 is approximately 0.006" wide and 0.001" deep. The trench 310 lies between a die attachment area 314 of the substrate 304 and the land location 312 for later connection of passive components. The trench 310 runs at least the full length of the die attachment surface 314 facing the solder location 312.

Referring to FIG. 3d, a first silk-screen operation places an ink pattern with a white color on the solder mask surface to provide component identification and location markings 316. In this case the white ink can provide a white background 316 to contrast a latter (shown later in FIG. 3e) black ink coating. With the same operation, white markings are placed to define a first layer of two ink dams 320, 322.

Referring to FIG. 3e, a second silk-screen operation places a black ink layer 321, 323 on top of the white ink layer 320, 322 of the dams and a black ink layer 317 of markings (such as identification and location markings) over the white ink layer. Each silk-screen layer of the ink dams is approximately 0.005" thick. The dual-layered ink dams 320/321, 322/323 may run parallel to the trench 310 and may be the same length as the trench 310. The dams 320/321, 322/323 and the trench 310 may all spaced approximately 0.010" apart from each other. The dams 320/321, 322/323 can each be approximately 0.050" wide. Any barrier element may be placed adjoining the die perimeter 314 meaning that it is close to or touching the die perimeter 314. In an embodiment, the trench 310 is placed closest to the die perimeter 314, the trench 310 can run parallel to the die perimeter 314, and the trench 310 can be positioned approximately 0.060" from the die perimeter 314. The dam 322/323 closest to the passive component solder location 312 is spaced approximately 0.020" from the solder location 312.

Referring to FIG. 3f, the dam 322, 323 placed nearest the solder location 312 may be etched with a trench 326. The etch process may be accomplished with a laser (such as a Diamond 84 or 64 manufactured by Coherent, Inc. in Santa Clara, Calif.). The etch process etches through the top surface of the black ink layer 323. The laser etch of the ink dam 323 layer creates a trench 326 in the black coating 323 that is approximately 0.006" wide, approximately 0.001–0.005" deep, and may run at the full length of the dam 322/323.

Referring to FIG. 3g, the die 329 is connected to the substrate 304 with solder bumps 331 and aided with underfill material 330. Excess underfill material 330 flows outward from between the substrate 304 and the die 329 and is controlled by a series of barrier elements; a trench 310, a dam, 320/321, and a second dam 322/323 having a trench etched 326 within.

As disclosed, during assembly of the die to the substrate, sufficient underfill material is deposited to flow through and completely fill around all the bumps on the flip-chip die. Barrier elements are placed in and on the substrate, between the flip-chip die attachment perimeter and the electrical passive components. The barrier elements limit flow of the excess underfill material as it squeezes out. The barrier elements can limit the flow of underfill material sufficient to preclude underfill material from reaching solder lands that later connect to passive electrical components or are already connected to passive electrical components.

With other embodiments, any number of barrier elements can be positioned between the die perimeter and the electrical solder lands of the passive components. The types of barrier elements, trenches, dams, and dams having trenches, can be placed in any combination. Any number of barrier elements may form a barrier to be positioned on the substrate. Any barrier element may be placed adjoining the die perimeter. The use of one or more barriers, or a barrier that partially or completely surrounds the die perimeter may be selected to allow closer positioning of passive electrical components to the die perimeter, a necessary requirement as die sizes increase and the number of passive electrical components increases. The color of the ink used to construct the dams may be of any color to provide the visible markings desired. Any number of layers to a dam may be silk-screened to construct a height of a dam.

In an embodiment, barriers may be applied to a package constructed of an organic material (OLGA) that is used with flip-chip packaging technology. An advantage with OLGA is that the CTE (coefficient of thermal expansion) of the organic package is more closely matched to that of the motherboard as compared to previous ceramic materials.

This ensures that the stresses induced in the package-to-motherboard interconnects are significantly lower, resulting in more reliable interconnections even when the interconnect count is large. In order to optimally access the superior electrical characteristics of the organic package, a high-density, high-performance method to connect the chip to the package is required. To that end, a solder-bump-based C4 area array flip-chip capability was developed to replace wire-bonding. In contrast to traditional wire bonding, C4 utilizes an area array method for interconnection. This enables the placing of many more bumps as virtual vias (through the thick electrical connections) connecting the metallization on the chip to the metallization on the package. The primary benefit of this approach is in power/ground distribution and clock routing. The C4 connections, in combination with the electrical characteristics of the copper-based organic package, result in a superior electrical environment where maximum performance can be realized. Once a flip-chip (die) is attached, the organic package such as the OLGA substrate can later be surface mounted directly to a board, mounted to a pinned substrate for socketing, or mounted to a cartridge (to be combined with other chips).

Mitigating noise resulting from management of the switching current is required. The high clock speed circuits and power conversation design techniques such as clock gating and SLEEP mode result in fast, unpredictable, and large magnitude changes in the supply current. The rate of change of many amps per nanosecond of this switching current far exceeds the ability of the power supply and the voltage regulator to respond. If not managed, these current transients manifest themselves as power supply noise that ultimately limits how fast the circuits can operate. This is further compounded by the reduced noise margin in the Complementary Metal-Oxide-Silicon (CMOS) logic circuits that result from power supply voltage scaling. To reduce this undesirable noise effect, the package must provide a very low inductance path for the switching current. As a result, charge storage devices, in the form of capacitors native to the silicon chip and augmented by capacitors on the package, are also necessary in some designs. As the number of electrical interconnections from the silicon die through the package to the system board increases, as the clock rate continues to increase, the number of capacitors required may increase. As a result of this, a reduction in the keep out area (for overflow of underfill material) restricting passive component placement becomes more important.

The fabrication of barrier trench elements can be accomplished with the construction of a solder mask coating. Solder masks coat a substrate and openings in the solder mask limit exposure of the substrate to solder during a solder operation. During production, printed circuit boards are passed through a soldering apparatus where one side is subjected to a soldering operation to solder hundreds of terminals on each of the boards. The use of wave soldering machines for this purpose is well known. These machines include conveyors that carry the boards over a molten bath of solder that is agitated to rise in waves against the undersides of the boards. Prior to wave soldering, a solder masking operation is required to protect portions of the boards from being contacted by the hot molten solder. The solder mask is applied as one or more coatings through well-known techniques such as sputter, spray, or silk-screen such as through a steel screen mesh. When the solder mask is applied with a screen mesh, a pattern in the mesh can provide openings in the solder mask to be later filled with the solder operation. After cure of the solder masking, wave soldering is performed to fill-in the areas open in the mask. The cured solder mask remains on the finished substrate providing good dielectric coverage for the circuit lines to be protected.

The fabrication of dam barrier elements can be accomplished with the same operation that provides component identification and descriptions. Component identification and descriptions are currently applied to the solder mask layer on surfaces of printed circuit boards. The materials used for this process are mixtures of resins and pigments that create raised lettering on the solder mask layer. The identification and descriptions may be applied with standard silk-screen methods and the materials may be cured either thermally or by ultraviolet radiation. The silk-screen process involves applying an ink coating to a patterned fabric and is a well-known technique in the industry. This silk-screen process may be applied to packaging substrates as well as printed circuit boards.

We claim:

1. An apparatus, comprising:
   a substrate having a surface;
   a die attached to the substrate surface;
   an underfill material positioned between the substrate surface and the die; and
   one or more operation layers deposited upon the substrate, each operation layer forming one or more barriers on the substrate surface, the one or more barriers positioned between the die and exposed solder lands on the substrate surface, wherein the one or more barriers redirect the flow of the underfill material.

2. The apparatus of claim 1, wherein the barriers each comprise:
   one or more barrier elements.

3. The apparatus of claim 2, wherein the barrier elements comprise: one or more trenches.

4. The apparatus of claim 2, wherein the barrier elements comprise: one or more dams.

5. The apparatus of claim 4, wherein one or more of the one or more dams contains a trench.

6. The apparatus of claim 2, wherein the one or more barrier elements, further comprises:
   one or more dams, and
   one or more trenches.

7. The apparatus of claim 6, wherein one or more of the one or more dams contains a trench.

8. The apparatus of claim 1, wherein the die is attached to the substrate with a C4 flip-chip.

9. The apparatus of claim 1, wherein the substrate is an OLGA material package.

10. The apparatus of claim 1, wherein the substrate is a printed circuit board.

11. A method, comprising:
    obtaining a substrate;
    depositing one or more operation layers upon the substrate;
    forming one or more dams on the substrate from the one or more operation layers;
    applying an underfill material;
    attaching the die to the substrate with the underfill material in between;
    flowing the underfill material from between the die and the substrate; and
    redirecting the flow of the underfill material with the one or more dams.

12. The method of claim 11, wherein controlling flow of the underfill material stops the underfill material from coating a solder land.

13. The method of claim 11, further comprises forming one or more trenches on the substrate from the one or more operation layers and controlling the flow of the underfill material with the one or more trenches.

14. The method of claim 13, where forming the one or more dams further comprises:
etching at least one of the one or more trenches in at least one of the one or more dams.

15. The method of claim 14, wherein etching one or more trenches further comprises:
laser etching.

16. A method, comprising:
obtaining a substrate;
coating the substrate with a solder mask, such that:
the solder mask contains openings that form one or more trenches, applying an underfill material;
attaching a die to the substrate with the underfill material in between, flowing the underfill material from between the die and the substrate; and
redirecting flow of the underfill material with the one or more trenches.

17. A method, comprising:
obtaining a substrate having a solder mask;
depositing a silk-screening a pattern onto the solder mask such that one or more dams are formed by the silk-screening pattern;
applying an underfill material;
attaching a die to the substrate with the underfill material in between,
flowing the underfill material from between the die and the substrate; and
controlling flow of the underfill material with the one or more dams.

18. The method of claim 17, further comprising:
coating the substrate with a solder mask, comprising:
leaving openings in the solder mask to form one or more trenches; and
controlling flow of the underfill material with the one or more trenches.

19. The apparatus of claim 1, further comprising:
wherein the one or more barriers are positioned between the die and passive electrical components on the substrate surface.

20. The apparatus of claim 11, wherein controlling flow of the underfill material stops the underfill material from coating a passive electrical device.

21. The apparatus of claim 1 wherein each of the one or more operation layers deposited upon the substrate is a layer of material selected from the group consisting of solder and ink.

* * * * *